(12) United States Patent
Vora et al.

(10) Patent No.: US 9,559,139 B2
(45) Date of Patent: Jan. 31, 2017

(54) INTEGRATED SCINTILLATOR GRID WITH PHOTODIODES

(71) Applicant: Terapede Systems Inc., Campbell, CA (US)

(72) Inventors: Madhukar B. Vora, Los Gatos, CA (US); Brian Rodricks, Los Gatos, CA (US)

(73) Assignee: TERAPEDE SYSTEMS INC., Campbell, CA (US)

( * ) Notice: Subject to any disclaimer, the term of this patent is extended or adjusted under 35 U.S.C. 154(b) by 0 days.

(21) Appl. No.: 14/863,748

(22) Filed: Sep. 24, 2015

(65) Prior Publication Data

US 2016/0181307 A1    Jun. 23, 2016

Related U.S. Application Data

(60) Provisional application No. 62/054,838, filed on Sep. 24, 2014.

(51) Int. Cl.
*G01T 1/20*     (2006.01)
*H01L 27/146*   (2006.01)
*H01L 27/12*    (2006.01)

(52) U.S. Cl.
CPC ..... *H01L 27/14663* (2013.01); *H01L 27/1203* (2013.01); *H01L 27/1464* (2013.01); *H01L 27/14629* (2013.01); *H01L 27/14685* (2013.01); *H01L 27/1463* (2013.01)

(58) Field of Classification Search
CPC ................................ G01T 1/202; G01T 1/2018
See application file for complete search history.

(56) References Cited

U.S. PATENT DOCUMENTS

2006/0131509 A1*  6/2006  Matz ............... G01T 1/2018
                                             250/370.11

* cited by examiner

*Primary Examiner* — Kiho Kim
(74) *Attorney, Agent, or Firm* — David R. Stevens; Stevens Law Group (57) ABSTRACT

Various embodiments of a structure implemented in an X-ray imaging system are described. In one aspect, a structure implemented in an X-ray imaging system includes a silicon wafer including a first side and a second side opposite the first side. The silicon wafer also includes an array of photodiodes on the first side of the silicon wafer with the photodiodes electrically isolated from each other as well as an array of grid holes on the second side of the silicon wafer. Each grid hole of the array of grid holes is aligned with a respective photodiode of the array of photodiodes. The structure also includes a layer of scintillating material disposed over the array of grid holes on the second side of the silicon wafer. The structure further includes a layer of reflective material disposed on the layer of scintillating material.

40 Claims, 11 Drawing Sheets

INTEGRATED SCINTILLATOR GRID WITH PHOTODIODES

CROSS REFERENCE TO RELATED PATENT APPLICATION

The present disclosure claims the priority benefit of U.S. Provisional Patent Application No. 62/054,838, filed on Sep. 24, 2014, which is incorporated by reference in its entirety.

TECHNICAL FIELD

The present disclosure relates to X-ray imaging and, more particularly, to an integrated scintillator grid with photodiodes.

BACKGROUND

Solid-state digital X-ray detectors, also referred to as X-ray sensors, of an X-ray imaging system can be constructed by employing either of two physical detection methods, so-called direct and indirect conversion methods. Generally, a direct conversion method makes use of direct production of electrons by X-rays in elemental compounds such as amorphous silicon or selenium, lead oxide, lead iodide, thallium bromide, or various gadolinium compounds. In this case, the electrons are collected via electric fields and electrodes attached to thin film transistors. On the other hand, an indirect conversion method employs conversion of X-ray interactions to flashes of light in well-known scintillating materials such as thallium-activated cesium iodide or gadolinium oxysulfate. In this case, the light flashes are sensed by photodiodes, and the resulting electron currents are again collected by attached transistor electronics.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified. Components in the figures are not drawn to scale and may be drawn out of proportion to facilitate ease of understanding of embodiments of the present disclosure.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

DETAILED DESCRIPTION

Figure 1:
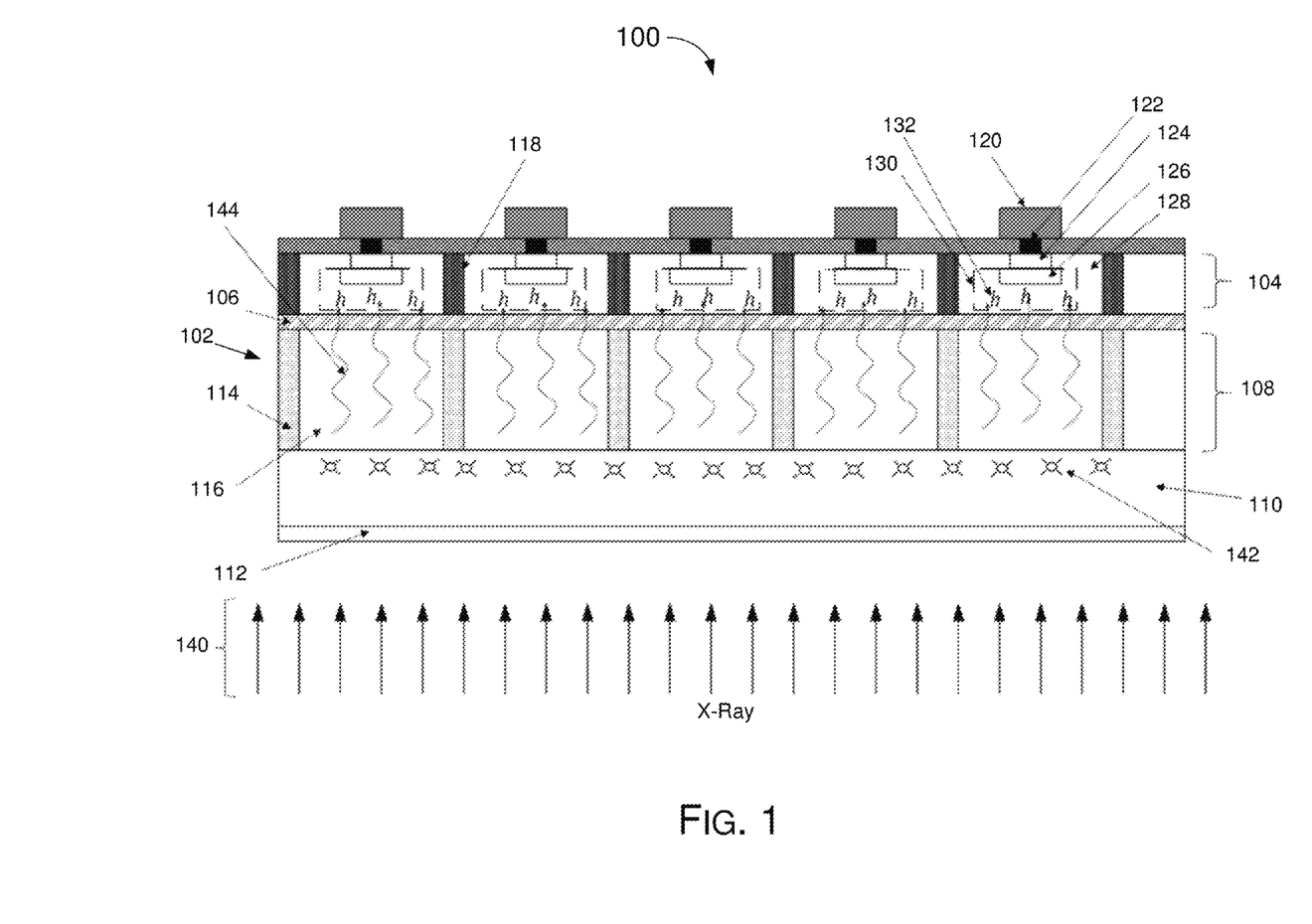
FIG. 1 is a cross-sectional view of a structure of an integrated scintillator grid with photodiodes of an X-ray imaging system in accordance with an embodiments of the present disclosure.

FIG. 1 illustrates a structure 100 of an integrated scintillator grid with photodiodes of an X-ray imaging system in accordance with an embodiments of the present disclosure. As shown in FIG. 1, structure 100 includes a silicon wafer 102. Silicon wafer 102 may include a device layer 104, an insulator layer 106 and a handle substrate 108. In some embodiments, silicon wafer 102 may be a silicon-on-insulator (SOI) wafer with a layer of buried oxide, which may be insulator layer 106. In some embodiments, thickness of the handle substrate 108 may be approximately 500 microns. In some embodiments, thickness of the buried oxide of the SOI wafer may be approximately 2500 angstroms. In some embodiments, device layer 104 may be an epi layer and may have a thickness of approximately 6 microns.

Device layer 104 may have an array of photodiodes constructed therein. That is, an array of photodiodes may be provided in device layer 104 on a first side (e.g., the top side of silicon wafer 102 shown in FIG. 1) of silicon wafer 102. The following description of a given photodiode of the array of photodiodes applies to each photodiode of the array. As shown in FIG. 1, each photodiode of the array of photodiodes may include a p region 126 formed in an n epi region 128 to form a PN diode. A contact diffusion of p+ impurities may be formed as a p+ region 124. In some embodiments, n+ isolation regions may be placed in n epi region 128 to isolate a depletion region 130 formed around the PN diode. In FIG. 1, depletion regions 130 are indicated by dashed lines around the p region 126. Structure 100 may additionally include an array of metal contacts 120 each of which is aligned with and corresponds to a respective photodiode of the array of photodiodes. Additionally, contacts 122 may be formed between the metal contacts 130 and photodiodes so that each photodiode is electrically connected to the respective metal contact 130.

Handle substrate 108 may have an array of grid holes 116 constructed therein. That is, an array of grid holes 116 may be provided in handle substrate 108 on a second side (e.g., the bottom side of silicon wafer 102 shown in FIG. 1) of silicon wafer 102. Grid holes 116 may be etched into the second side of silicon wafer 102 by any suitable process. In some embodiments, width of each grid hole 116 may be approximately 100 microns or more and thickness of sidewalls 114 of grid holes 116 may be approximately 100 microns or more. A layer of scintillating material 110 may be disposed over the array of grid holes 116 on the second side of silicon wafer 102 to cover up the array of grid holes 116. Additionally, a layer of reflective material 112 may be disposed on the layer of scintillating material 110. In some embodiments, scintillating material 110 may include CsI:Ta or Gaddox. In some embodiments, reflective material 112 may include aluminum (Al).

In operation, an object may be placed between an X-ray source and an X-ray imaging system in which the structure 100 of an integrated scintillator grid with photodiodes is implemented. Incident X-rays on the X-ray imaging system will mirror the nature of the object. Dense parts of the object tend to absorb significant amount of the X-rays and lighter parts of the object tend to let through most of the X-rays. As a result, spatial distribution of the X-ray dose represents the image of the object.

As shown in FIG. 1, X-rays 140 coming through an object are radiated on the second side (e.g., the bottom side) of silicon wafer 102. X-rays 140 will go through the layer of reflective material 112 and go into the layer of scintillating material 110 up to a distance D measured from an interface between the layer of reflective material 112 and the layer of scintillating material 110. Distance D depends on the type of scintillating material 110 used. When CsI:TA is utilized in scintillating material 110 the distance D may be approximately 300 microns. Thickness of the scintillating material 110 in FIG. 1 is larger than D so that when X-rays 140 are converted into light 142 most of the X-rays are absorbed to give highest X-ray-to-light conversion efficiency. Light 144 travels through grid holes 116 and the layer of insulator 106 (e.g., buried oxide), and travel into the silicon of device layer 104 including the PN diodes, which may be in reverse bias of −2V at p+ contact and 0.0V at n+ isolation layer common to all the PN diodes. In some embodiments, each of the PN diodes may be designed such that most of the light is absorbed in the depletion layer 130 above and around the PN diode. Light photon in the depletion layer 130 will generate electron-hole pairs. The electric field in the depletion region 130 will cause holes 146 (shown as "h" in FIG. 1) to travel towards p region 126, p+ region 124 and contact 122, thereby generating photocurrent at a fixed bias voltage. This current can be sensed and can be related to incident X-ray radiation.

An alternative way to sense X-ray photons is to precharge the PN diodes with a fixed voltage, such as 2.0V for example, through a MOS transistor prior to radiating with X-rays and turn off the MOS transistor, before radiating with X-rays. Light generated by the scintillating material 110 will be converted to hole-electron pairs and the PN diodes will start discharging to a voltage level corresponding to the incident light 144 or X-rays 140. Now, by adding one more MOS transistor, the voltage on the PN diode can be sensed and amplified using more MOS transistors. Sensing circuits that perform such functions are well known in industry and, thus, in the interest of brevity a detailed description thereof is not provided herein.

A sense chip having an array of sensing circuits as described above may be formed over the first side (e.g., top side) of silicon wafer 102 such that each sensing circuit of the array of sensing circuits is configured to sense an electrical signal in a respective photodiode of the array of photodiodes corresponding to electron-hole pairs in the respective photodiode caused by light absorbed by the respective photodiode. Each sensing circuit along with its corresponding photodiode may form a pixel. Silicon wafer 102, which an array of photodiodes in the device layer 104 and an array of grid holes 116 in the handle substrate 108, may be referred to as a photo chip hereinafter. Each pair of photodiode and its corresponding grid hole 116 may be referred to as a photo pixel hereinafter. The circuit needed to pre-charge and sense the electrical signal in a corresponding photodiode may be referred to as sense pixel hereinafter. An array of sense pixels along with peripheral circuits to select and sense the electrical signals, e.g., voltage, generated by photodiodes is placed on top of the array of photo pixels so that all the photodiodes under the sense chip are addressed by all the sense pixels in the sense chip. Each sense pixel may include a contact pad that is aligned to a contact pad in the corresponding photo pixel that is connected to the respective photodiode. Thus, a sense pixel is connected to photo pixels.

When X-rays 140 are radiated as shown in FIG. 1, it is converted into light 142 by the layer of scintillating material 110 and in turn light 144 traveling through each grid hole 116 is converted to electron-hole pairs in the respective photodiode under the grid hole 116. Electron-hole pairs will recombine in the photodiodes and a voltage corresponding to X-rays 140 or light 144 in the grid hole will be generated. Sense chip may be designed to sense electrical signals, e.g., voltage, from all the photodiodes, convert the sensed electrical signals into digital data and stream the digital data out to a digital signal processor (DSP) for signal processing and generation of an image of the object.

In view of the above, it will be appreciated by those of ordinary skill in the art that the proposed scheme provides a number of advantages over conventional designs of the X-ray detector or sensor in an X-ray imaging systems. Firstly, structure 100 as shown in FIG. 1 does not require filling of the grid holes 116. Secondly, while the X-ray-to-light conversion efficiency is about 6% for conventional designs in which grid holes are filled with scintillating material, the proposed scheme can result in an X-ray-to-light conversion efficiency of more than 50%. Moreover, the proposed scheme can achieve very high modular transfer function or contrast.

For proof of concept, a chip with through-holes of 90-micron and 10-micron walls were fabricated. A scintillator sheet was placed on one side of the chip. X-rays were radiated on the scintillator sheet. The observed X-ray-to-light conversion efficiency was more than 60%.

Figure 2:
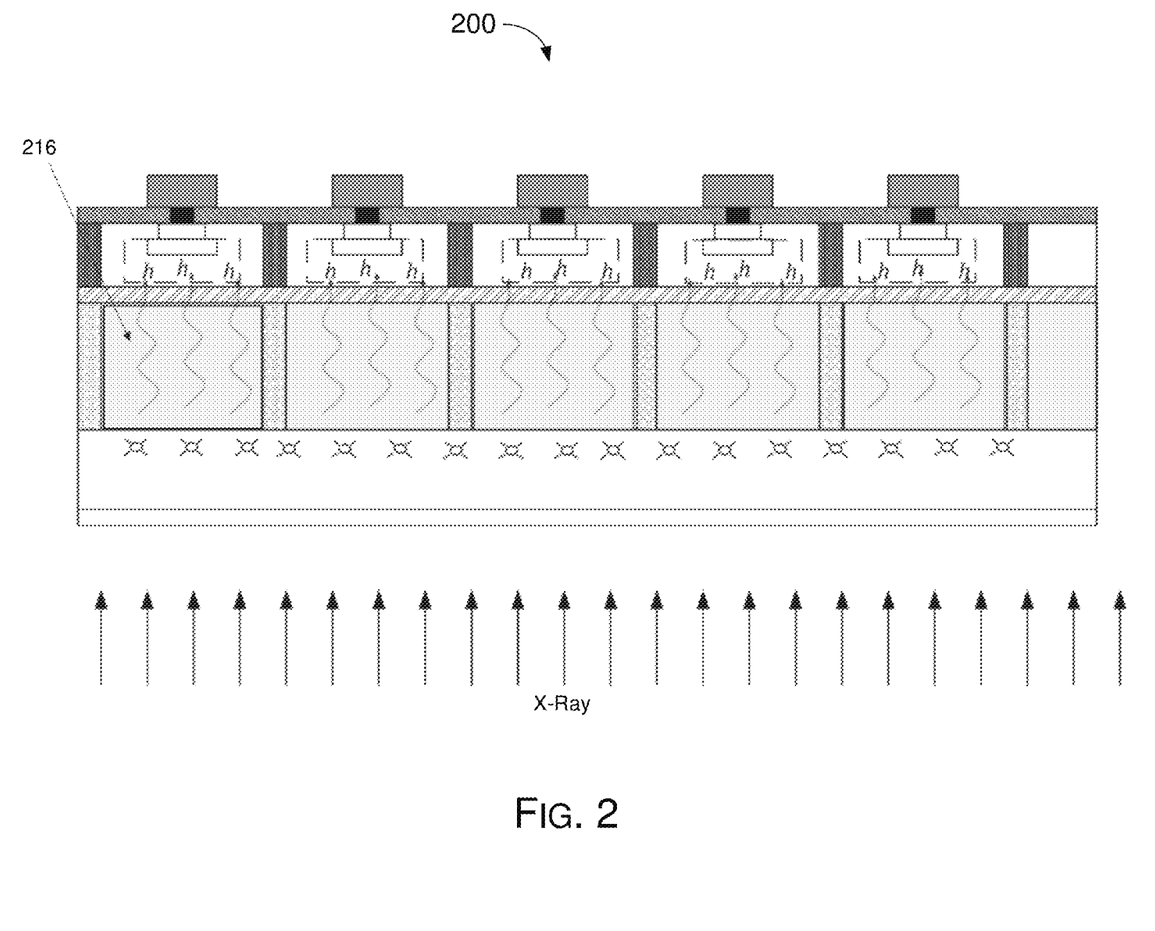
FIG. 2 is a cross-sectional view of a structure of an integrated scintillator grid with photodiodes of an X-ray imaging system in accordance with another embodiments of the present disclosure.

FIG. 2 is a cross-sectional view of a structure 200 of an integrated scintillator grid with photodiodes of an X-ray imaging system in accordance with another embodiments of the present disclosure. Structure 200 may be similar or identical to structure 100 in various aspects and, thus, detailed description of structure 200, except for any difference, is not provided in the interest of brevity. In structure 200, the grid holes are filled with a filler material 216. In some embodiments, filler material 216 may be a transparent solid material such as, for example, silicon dioxide ($SiO_2$), polyimide coatings or any transparent glass. This feature provides firmness to the silicon wafer of structure 200 for mechanical handling.

Alternatively, filler material 216 may be a scintillating material such as, for example, CsI:Ta. The scintillating material, e.g., CsI:Ta, may be deposited in the grid holes by evaporation or by melting powder CsI:Ta. Once grid holes are filled, an additional layer of CsI:Ta may be deposited over the array of filled grid holes. In some embodiments, about 300 microns of CsI:Ta may be deposited in the grid holes and additional 300 microns of CsI:Ta may be deposited on the top of the array of filled grid holes. One main advantage of this feature is that CsI:Ta in the grid holes will pick up X-rays that have not been absorbed in the CsI:Ta layer that is deposited over the array of filled grid holes.

Figure 3A:
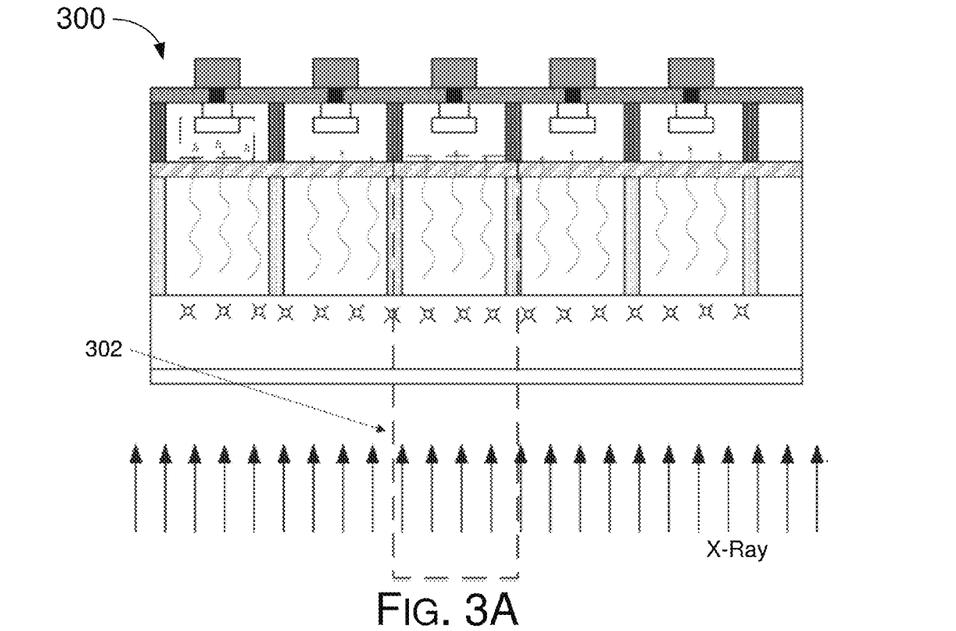
FIG. 3A is a cross-sectional view of a structure of an integrated scintillator grid with photodiodes of an X-ray imaging system in accordance with yet another embodiments of the present disclosure.
Figure 3B:
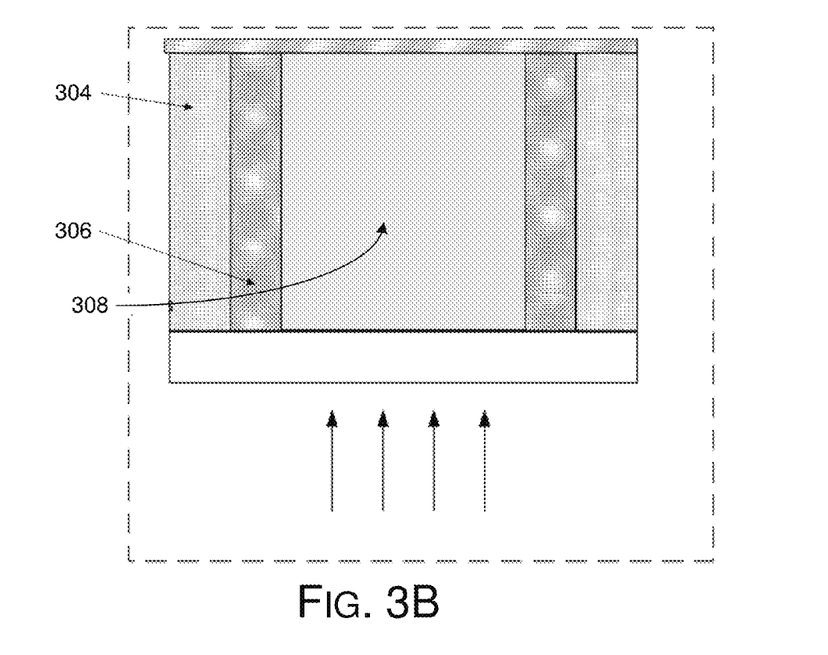
FIG. 3B is an enlarged view of the dash-lined portion of the structure of FIG. 3A.

FIG. 3A is a cross-sectional view of a structure 300 of an integrated scintillator grid with photodiodes of an X-ray imaging system in accordance with yet another embodiments of the present disclosure. FIG. 3B is an enlarged view of the dash-lined portion 302 of structure 300. Structure 300 may be similar or identical to structure 100 in various aspects and, thus, detailed description of structure 300, except for any difference, is not provided in the interest of brevity. In structure 300, silicon sidewalls 304 of the grid holes are coated with a cladding material 306 with suitable refractive index. The grid holes are filled with appropriate glass 308 to form a structure similar to fiber optic cable. This design will improve the light transmission through the grid holes significantly.

Figure 4A:
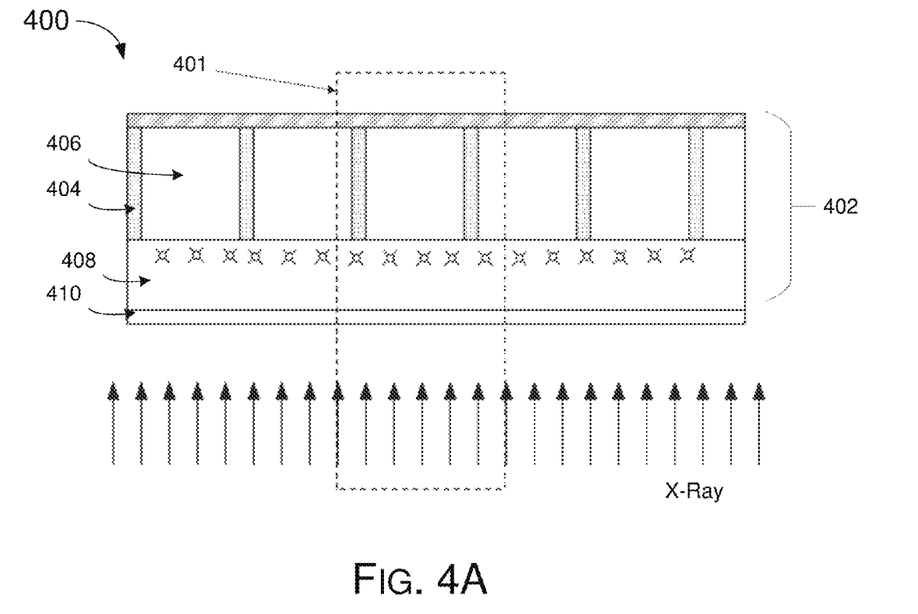
FIG. 4A is a cross-sectional view of an optical guide structure in accordance with an embodiments of the present disclosure.
Figure 4B:
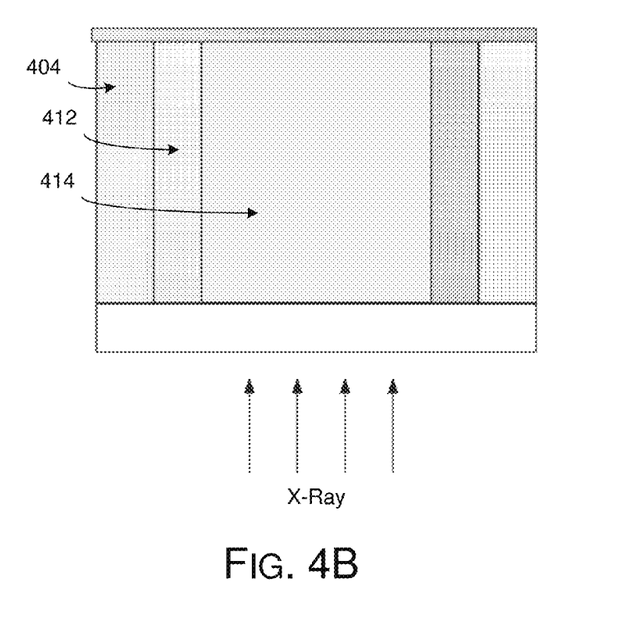
FIG. 4B is an enlarged view of the dash-lined portion of the optical guide structure of FIG. 4A.

FIG. 4A is a cross-sectional view of an optical guide structure 400 in accordance with an embodiments of the present disclosure. FIG. 4B is an enlarged view of the dash-lined portion 401 of optical guide structure 400. As shown in FIG. 4A, optical guide structure 400 includes a silicon wafer 402. Silicon wafer 402 may have an array of grid holes 406 constructed therein. Grid holes 406 may be etched into silicon wafer 402 by any suitable process. In some embodiments, width of each grid hole 406 may be approximately 100 microns or more and thickness of sidewalls 404 of grid holes 406 may be approximately 100 microns or more. A layer of scintillating material 408 may be disposed over the array of grid holes 406 to cover up the array of grid holes 406. Additionally, a layer of reflective material 410 may be disposed on the layer of scintillating material 408. In some embodiments, scintillating material 408 may include CsI:Ta or Gaddox. In some embodiments, reflective material 410 may include aluminum.

As shown in FIG. 4B, in some embodiments, silicon sidewalls 404 of grid holes 406 are coated with a cladding material 412 with suitable refractive index. Grid holes 406 may be filled with appropriate glass 414 to form a structure similar to fiber optic cable. This design will improve the light transmission through the grid holes 406 significantly.

FIGS. 5A-5D show a cross-sectional view of a structure 500 of an integrated scintillator grid with photodiodes of an X-ray imaging system during a fabrication process in accordance with an embodiment of the present disclosure. Structure 500 may be similar or identical to structure 100 (grid holes not filled) or structure 200 (grid holes filled with filler material) in various aspects and, thus, detailed description of structure 500, except for any difference, is not provided in the interest of brevity.

Figure 5A:
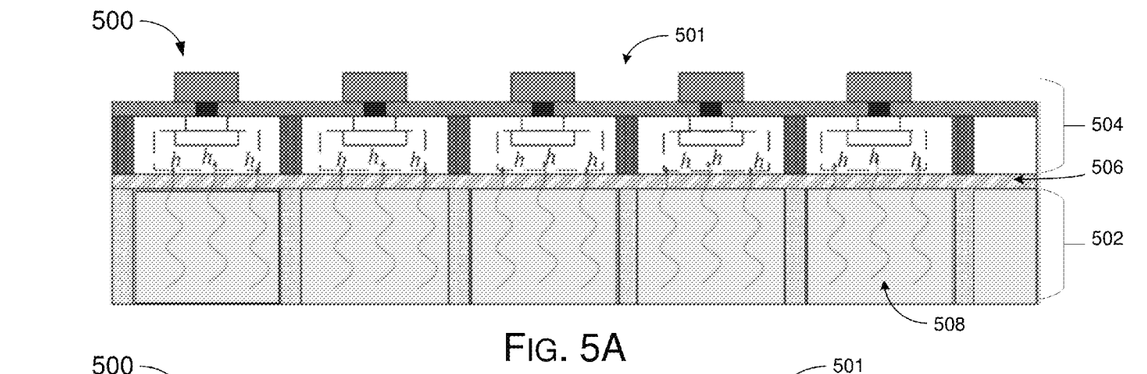
FIG. 5A shows a cross-sectional view of a structure of an integrated scintillator grid with photodiodes of an X-ray imaging system during a fabrication process in accordance with an embodiment of the present disclosure.

As shown in FIG. 5A, structure 500 includes a silicon wafer 501. Silicon wafer 501 may include a device layer 504, an insulator layer 506 and a handle substrate 502. In some embodiments, silicon wafer 501 may be a SOI wafer with a layer of buried oxide, which may be insulator layer 506. Device layer 504 may have an array of photodiodes constructed therein. That is, an array of photodiodes may be provided in device layer on a first side (e.g., the top side of silicon wafer 501 shown in FIG. 5A) of silicon wafer 501. Handle substrate 502 may have an array of grid holes 508 constructed therein. That is, an array of grid holes 508 may be provided in handle substrate 502 on a second side (e.g., the bottom side of silicon wafer 501 shown in FIG. 5A) of silicon wafer 501.

Figure 5B:
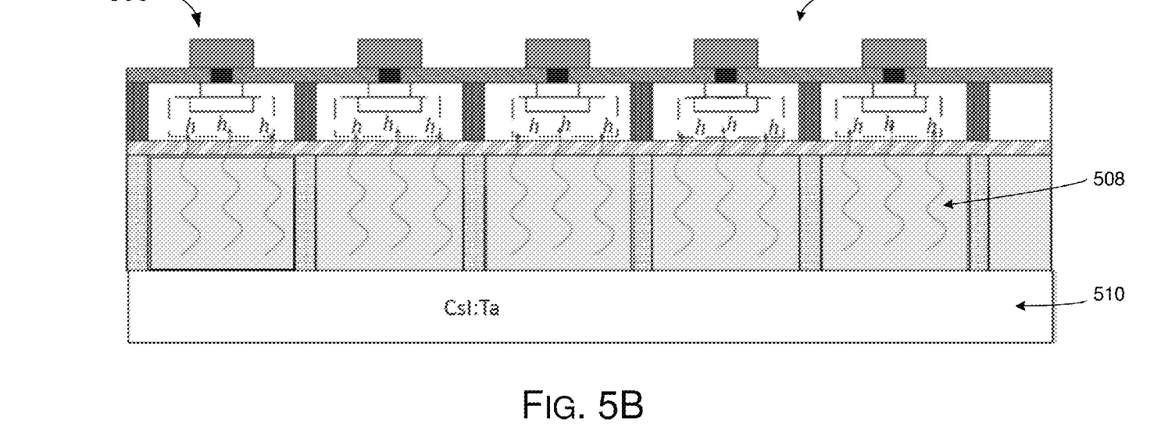
FIG. 5B shows a cross-sectional view of the structure of FIG. 5A in a subsequent stage of the fabrication process in accordance with an embodiment of the present disclosure.

As shown in FIG. 5B, a layer 510 of scintillating material, such as CsI:Ta or another scintillating material, is deposited on the back side of the silicon wafer. In some embodiments, thickness of the layer of scintillating material may be 300 microns.

Figure 5C:
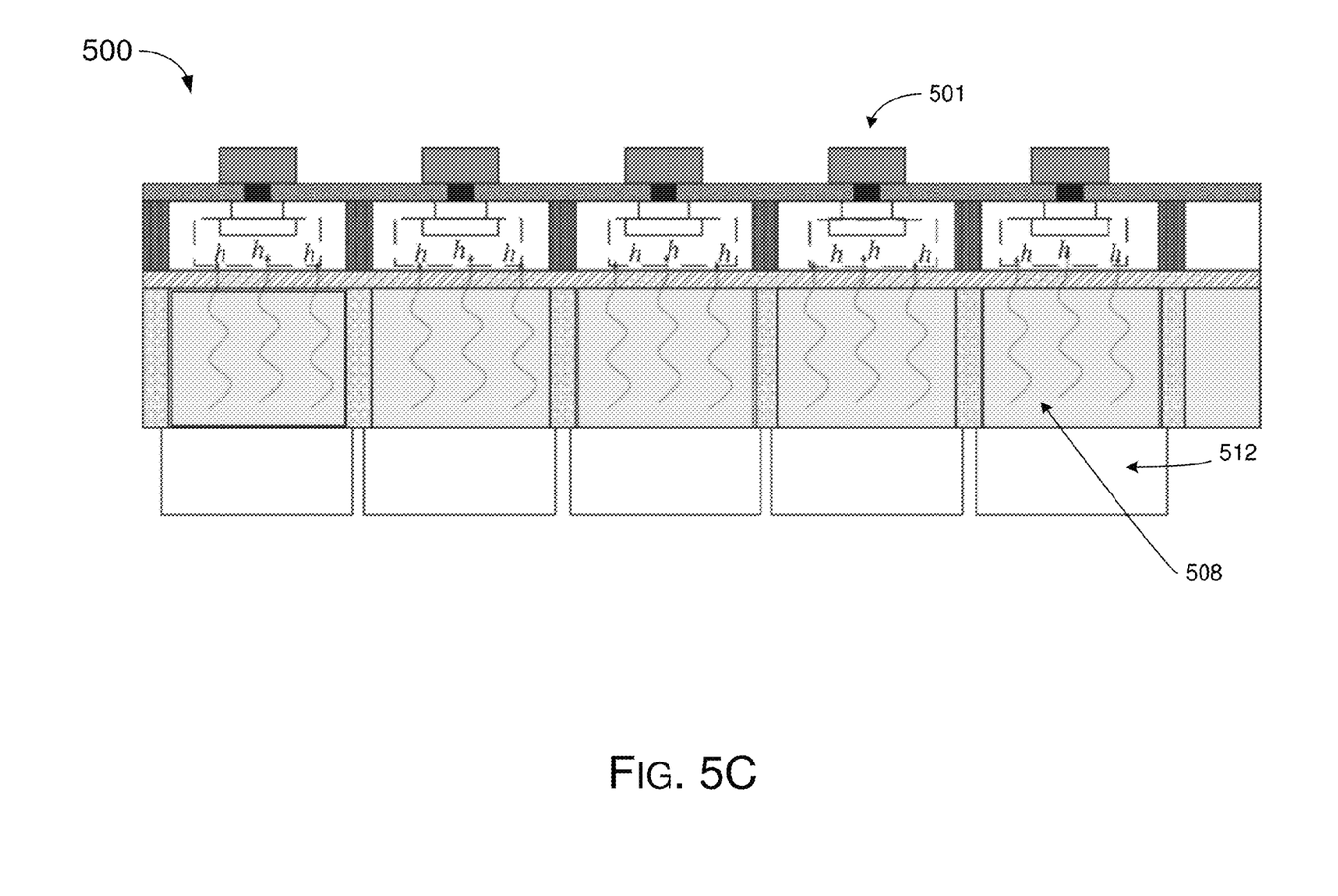
FIG. 5C shows a cross-sectional view of the structure of FIG. 5B in a subsequent stage of the fabrication process in accordance with an embodiment of the present disclosure.

As shown in FIG. 5C, the layer 510 of scintillating material is etched to form an array of scintillators 512 (or islands of scintillating material) isolated from each other such that each scintillator 512 covers a respective grid hole 508 of the array of grid holes 508. In some embodiments, a layer of poly(p-xylylene) polymers (not shown), such as Parylene, may be deposited to protect the scintillating material from moisture. Parylene is the trade name for a variety of chemical vapor deposited poly(p-xylylene) polymers used as moisture and dielectric barriers.

Figure 5D:
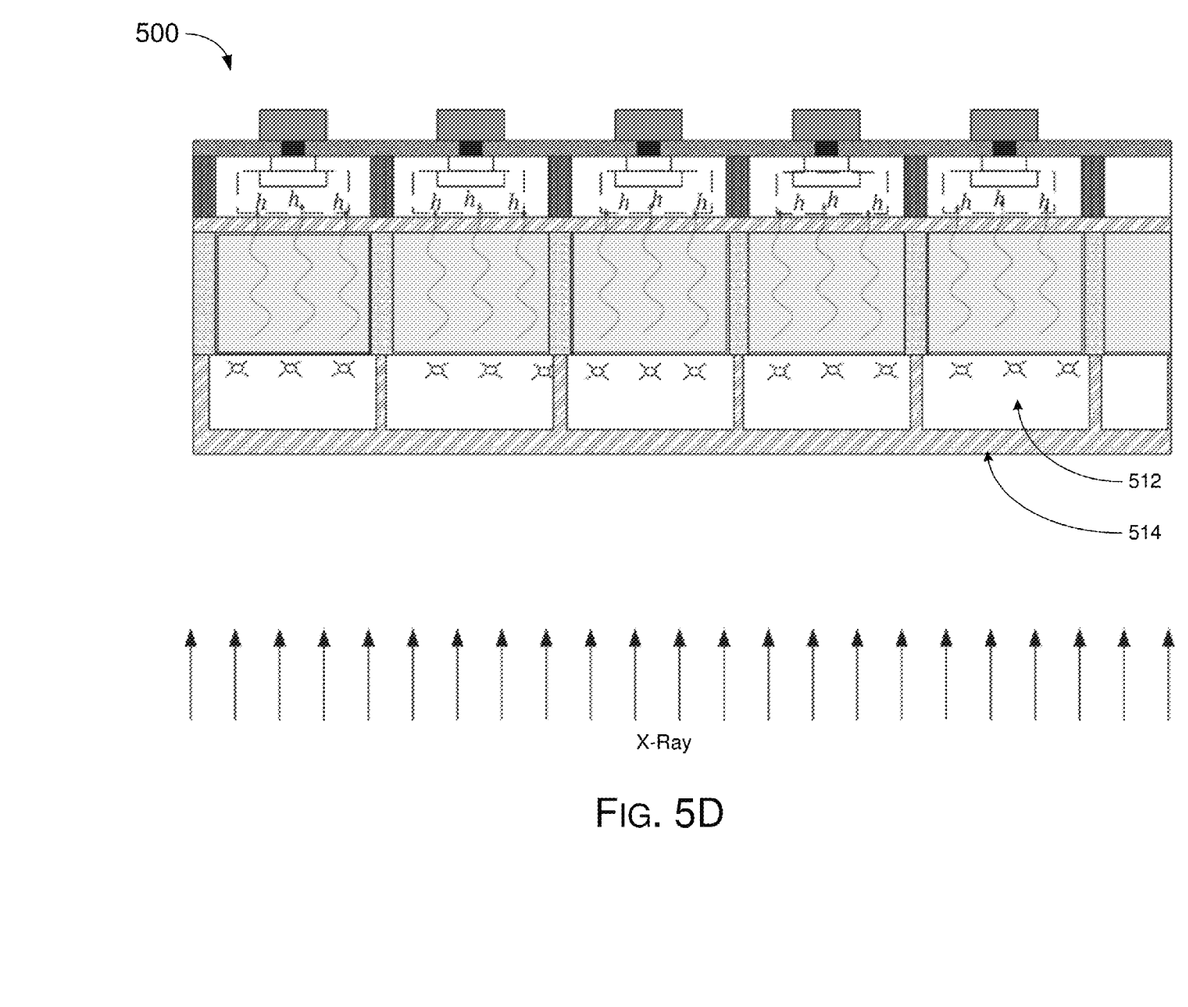
FIG. 5D shows a cross-sectional view of the structure of FIG. 5C in a subsequent stage of the fabrication process in accordance with an embodiment of the present disclosure.

As shown in FIG. 5D, a layer 514 of reflective material, such as aluminum or another suitable material, is deposited over the array of scintillators 512. There are several reasons for using aluminum as the reflective material. Firstly, aluminum can reflect light back into grid holes 508 thereby increasing the light that enters the grid holes 508. Secondly, aluminum reduces loss of light going sideways. Thirdly, aluminum blocks the light in a given grid hole 508 going to neighboring grid hole(s) 508.

Figure 6:
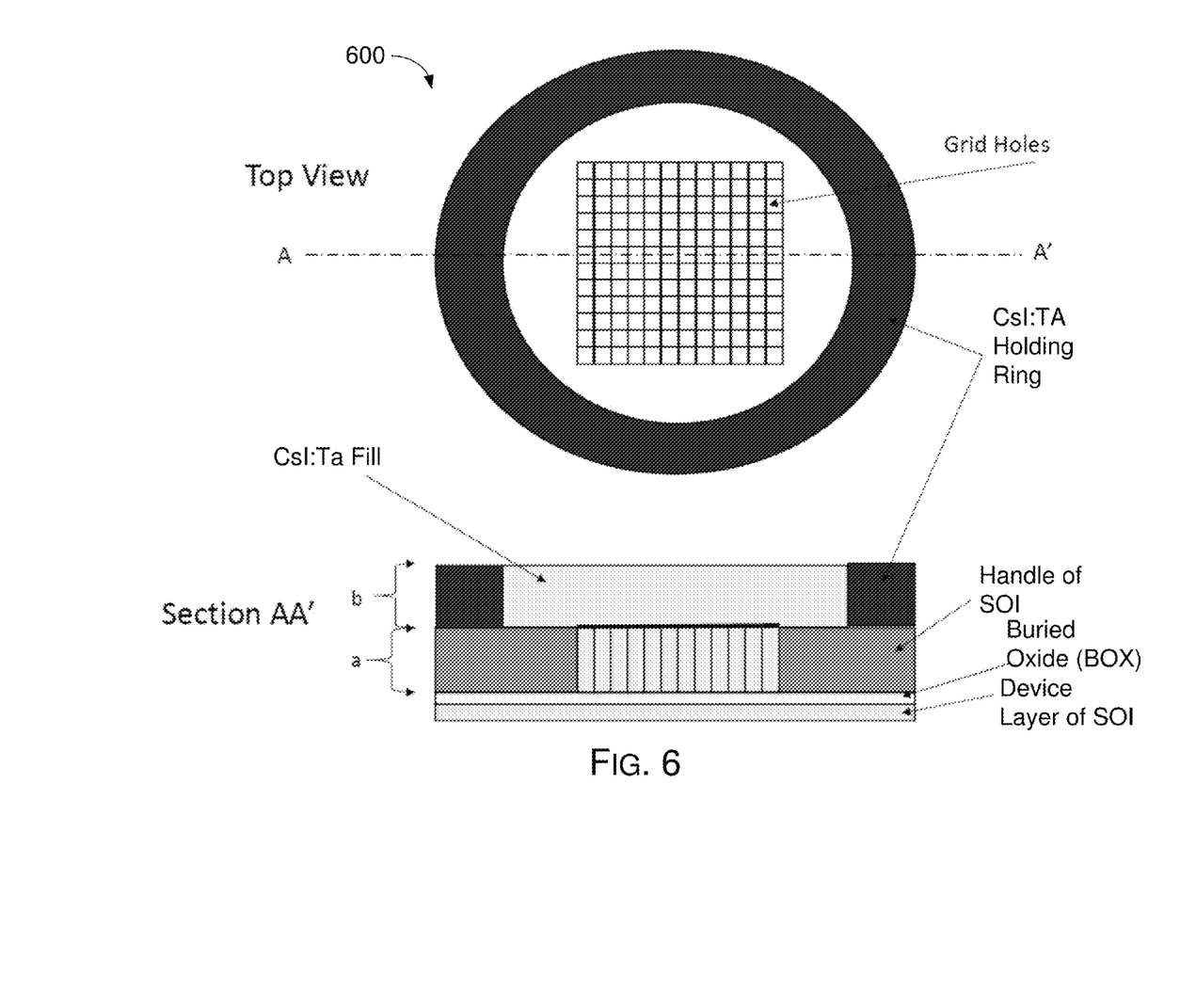
FIG. 6 is a top view and a cross-sectional view of a structure of an integrated scintillator grid with photodiodes of an X-ray imaging system in accordance with still another embodiments of the present disclosure.

FIG. 6 shows a top view and a cross-sectional view of a structure 600 of an integrated scintillator grid with photodiodes of an X-ray imaging system in accordance with still another embodiments of the present disclosure. Structure 600 may be similar or identical to structure 100 (grid holes not filled) or structure 200 (grid holes filled with filler material) in various aspects and, thus, detailed description of structure 500, except for any difference, is not provided in the interest of brevity.

In the example shown in FIG. 6, thickness "a" of handle substrate of the SOI wafer is approximately 300 microns, and thickness "b" of the layer of scintillating material is approximately 200 microns. A holding ring may be utilized to contain the layer of scintillating material, e.g., CsI:Ta, therein.

Figure 7A:
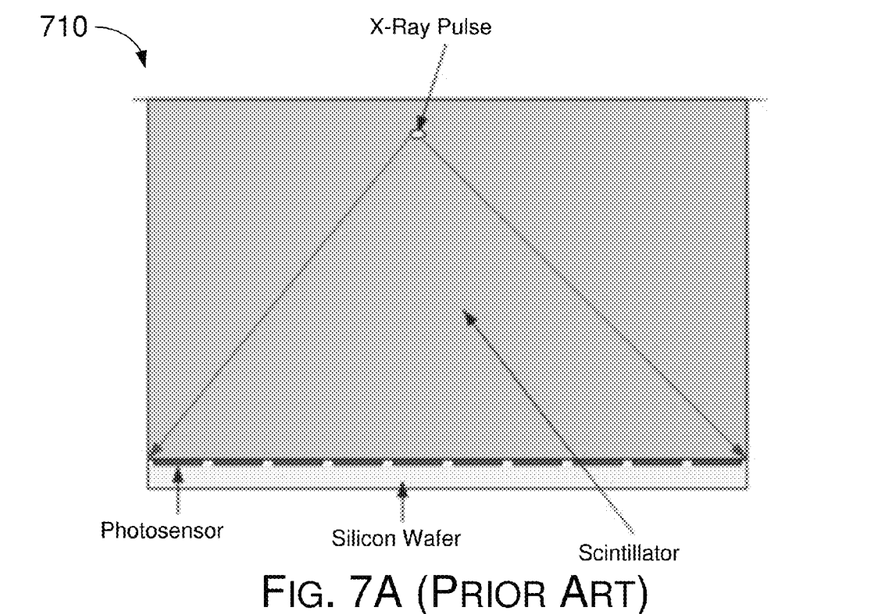
FIG. 7A is a cross-sectional view of a conventional X-ray imaging system in operation.

FIG. 7A is a cross-sectional view of a conventional X-ray imaging system 710 in operation. As shown in FIG. 7A, an X-ray pulse in the scintillator may scatter in a wide scattering angle (represented by the two angled lines with arrows) and be sensed by any one of the photo sensors within the scattering angle. As a result, the detected image of an object may have less-than ideal resolution and may be blurry.

Figure 7B:
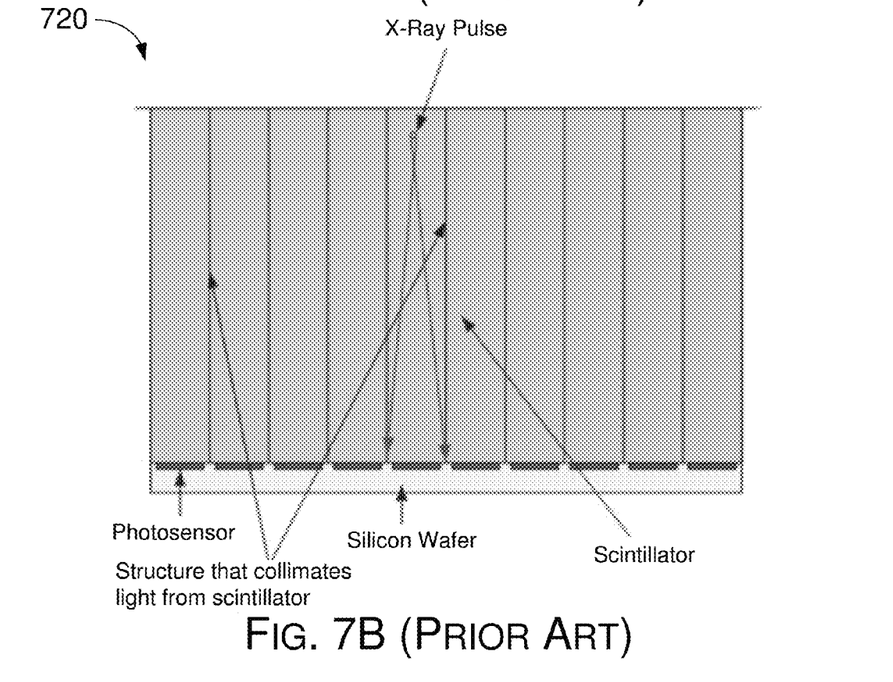
FIG. 7B is a cross-sectional view of another conventional X-ray imaging system in operation.

FIG. 7B is a cross-sectional view of another conventional X-ray imaging system 720 in operation. As shown in FIG. 7B, an X-ray pulse in the scintillator within sidewalls of a collimating structure, e.g., grid holes, may scatter in a narrow scattering angle (represented by the two angled lines with arrows) and be sensed by one photo sensor that corresponds to the particular grid hole. This design, however, tends to have a less-than-optimal X-ray-to-light conversion efficiency.

Figure 8:
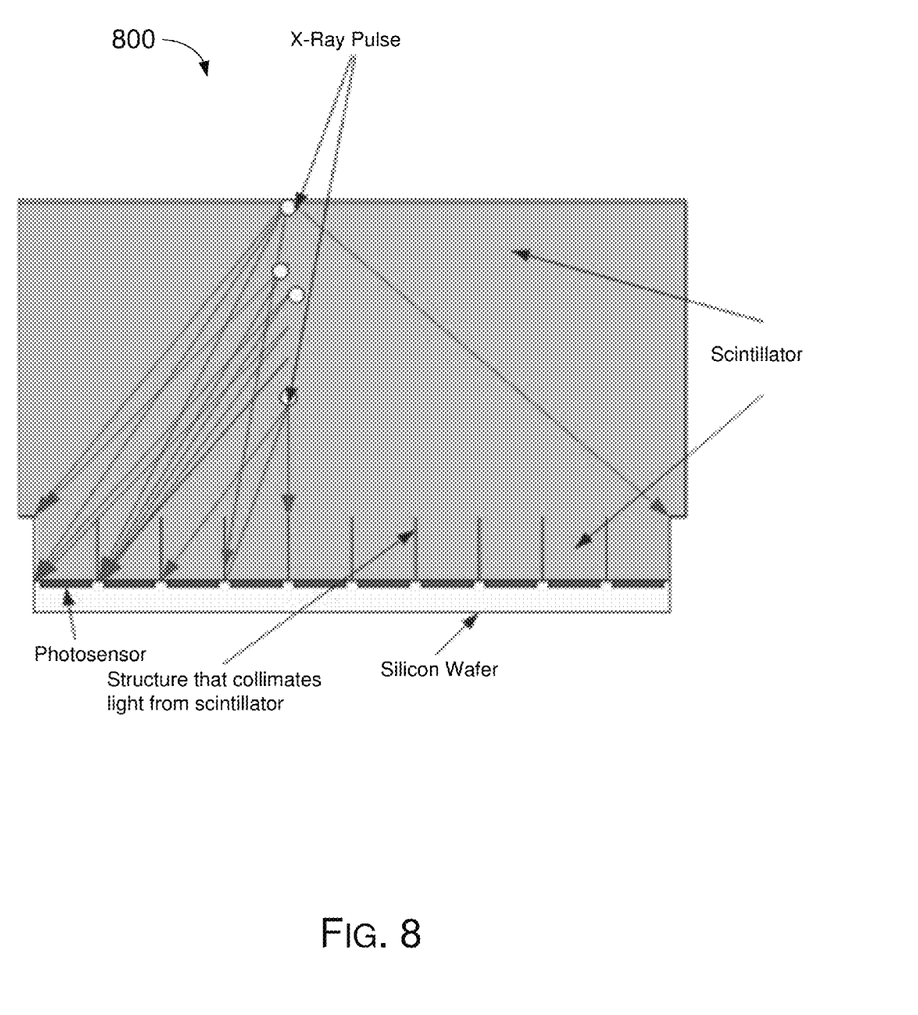
FIG. 8 is a cross-sectional view of an X-ray imaging system in accordance with an embodiment of the present disclosure in operation.

FIG. 8 is a cross-sectional view of an X-ray imaging system 800 in accordance with an embodiment of the present disclosure. X-ray imaging system 800 may utilize a structure similar to any of structures 100, 200, 300 and 500 as well as optical guide structure 400 as described above. As shown in FIG. 8, each of incoming X-ray pulses has a relatively wider scattering angle when in the scintillator and a relatively narrower scattering angle when within the collimating structure, e.g., grid holes. This design results in optimal X-ray-to-light conversion efficiency.

Figure 9:
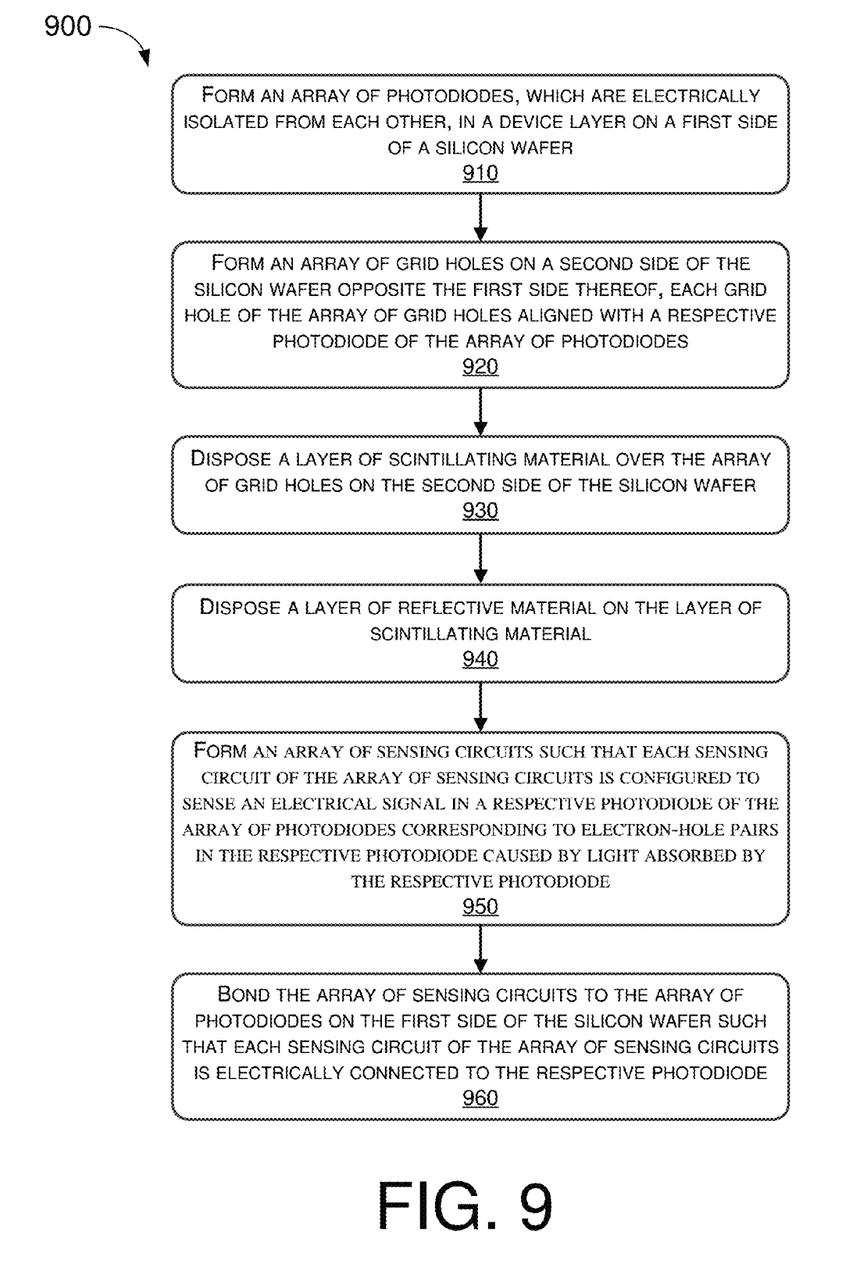
FIG. 9 is a flowchart of a fabrication process of a structure of an integrated scintillator grid with photodiodes in accordance with an embodiments of the present disclosure.

FIG. 9 is a flowchart of a fabrication process 900 of a structure of an integrated scintillator grid with photodiodes in accordance with an embodiments of the present disclosure. Process 900, wholly or partially, may be implemented to fabricate any of structures 100, 200, 300 and 500 as well as optical guide structure 400 as described above. Further, process 900 may include one or more operations, actions, or functions depicted by one or more blocks 910, 920, 930, 940, 950 and 960. Although illustrated as discrete blocks, various blocks may be divided into additional blocks, combined into fewer blocks, or eliminated, depending on the desired implementation.

At 910, process 900 may form an array of photodiodes on a first side of a silicon wafer. For example, process 900 may form an array of photodiodes, which are electrically isolated from each other, in a device layer on a first side of a silicon wafer.

At 920, process 900 may form an array of grid holes on a second side of the silicon wafer opposite the first side. For example, process 900 may form an array of grid holes on a second side of the silicon wafer opposite the first side thereof, with each grid hole of the array of grid holes aligned with a respective photodiode of the array of photodiodes.

At 930, process 900 may dispose a layer of scintillating material over the array of grid holes on the second side of the silicon wafer.

At 940, process 900 may dispose a layer of reflective material on the layer of scintillating material.

At 950, process 900 may form an array of sensing circuits configured to sense electrical signals in the photodiodes. For example, process 900 may form an array of sensing circuits such that each sensing circuit of the array of sensing circuits is configured to sense an electrical signal in a respective photodiode of the array of photodiodes corresponding to electron-hole pairs in the respective photodiode caused by light absorbed by the respective photodiode.

At 960, process 900 may bond the array of sensing circuits to the array of photodiodes. For example, process 900 may bond the array of sensing circuits to the array of photodiodes on the first side of the silicon wafer such that each sensing circuit of the array of sensing circuits is electrically connected to the respective photodiode.

In some embodiments, the silicon wafer may include a silicon-on-insulator (SOI) wafer.

In some embodiments, the grid holes on the second side of the SOI wafer may reach an insulator of the SOI wafer.

In some embodiments, the scintillating material may include CsI:Ta.

In some embodiments, the reflective material may include aluminum (Al).

In some embodiments, in disposing the layer of scintillating material over the array of grid holes, the method may perform operations including: filling the grid holes with the scintillating material; and depositing the layer of scintillating material over the array of grid holes which are filled with the scintillating material.

In some embodiments, a thickness of the layer of scintillating material may be greater than or equal to a depth of the grid holes.

In some embodiments, the method may further include filling the grid holes with a filler material.

In some embodiments, the filler material may include a transparent solid material. In some embodiments, the transparent solid material may include silicon dioxide ($SiO_2$), polyimide, or glass.

Alternatively, the filler material may include a scintillating material. In some embodiments, the scintillating material may include CsI:Ta.

In some embodiments, the method may further include, prior to filling the grid holes with the filler material, coating a layer of refractive material on sidewalls of the grid holes.

In some embodiments, the method may further include, prior to disposing the layer of reflective material on the layer of scintillating material, etching the layer of scintillating material into an array of scintillators such that each scintillator of the array of scintillators is physically separate from each other and covers a respective grid hole of the array of grid holes.

In some embodiments, the method may further include depositing a layer of poly(p-xylylene) polymers on the array of scintillators.

Highlights of Features

In view of the above, features of various embodiments of the present disclosure are highlighted below.

In one aspect, a structure implemented in an X-ray imaging system may include a silicon wafer. The silicon wafer may include a first side and a second side opposite the first side. The silicon wafer may also include an array of photodiodes on the first side of the silicon wafer with the photodiodes electrically isolated from each other. The silicon wafer may further include an array of grid holes on the second side of the silicon wafer. Each grid hole of the array of grid holes may be aligned with a respective photodiode of the array of photodiodes. The structure may also include a layer of scintillating material disposed over the array of grid holes on the second side of the silicon wafer. The structure may further include a layer of reflective material disposed on the layer of scintillating material.

In some embodiments, the silicon wafer may include a silicon-on-insulator (SOI) wafer.

In some embodiments, the grid holes on the second side of the SOI wafer may reach an insulator of the SOI wafer.

In some embodiments, the scintillating material may include CsI:Ta.

In some embodiments, the reflective material may include aluminum (Al).

In some embodiments, the grid holes may be filled with a filler material.

In some embodiments, the filler material may include a transparent solid material. In some embodiments, the transparent solid material may include silicon dioxide ($SiO_2$), polyimide, or glass.

Alternatively, the filler material may include a scintillating material. In some embodiments, the scintillating material may include CsI:Ta.

In some embodiments, a thickness of the layer of scintillating material may be greater than or equal to a depth of the grid holes.

In some embodiments, the structure may further include a layer of refractive material on sidewalls of the grid holes.

In some embodiments, the layer of scintillating material may include an array of scintillators such that each scintillator of the array of scintillators is physically separate from each other and covers a respective grid hole of the array of grid holes.

In some embodiments, the structure may further include a layer of poly(p-xylylene) polymers deposited on the array of scintillators.

In some embodiments, the structure may further include an array of sensing circuits. Each sensing circuit of the array of sensing circuits may be electrically connected to the respective photodiode. Each sensing circuit of the array of sensing circuits may be configured to sense an electrical signal in a respective photodiode of the array of photodiodes corresponding to electron-hole pairs in the respective photodiode caused by light absorbed by the respective photodiode.

In another aspect, a structure implemented in an X-ray imaging system may include a silicon wafer. The silicon wafer may include a first side and a second side opposite the first side. The silicon wafer may also include an array of grid holes on the second side of the silicon wafer. Each grid hole of the array of grid holes may be aligned with a respective photodiode of the array of photodiodes. The structure may also include a layer of scintillating material disposed over the array of grid holes on the second side of the silicon wafer. The structure may further include a layer of reflective material disposed on the layer of scintillating material.

In some embodiments, the silicon wafer may include a silicon-on-insulator (SOI) wafer.

In some embodiments, the grid holes on the second side of the SOI wafer may reach an insulator of the SOI wafer.

In some embodiments, the scintillating material may include CsI:Ta.

In some embodiments, the reflective material may include aluminum (Al).

In some embodiments, the grid holes may be filled with a filler material.

In some embodiments, the filler material may include a transparent solid material. In some embodiments, the transparent solid material may include silicon dioxide (SiO$_2$), polyimide, or glass.

Alternatively, the filler material may include a scintillating material. In some embodiments, the scintillating material may include CsI:Ta.

In some embodiments, a thickness of the layer of scintillating material may be greater than or equal to a depth of the grid holes.

In some embodiments, the structure may further include a layer of refractive material on sidewalls of the grid holes.

In some embodiments, the layer of scintillating material may include an array of scintillators such that each scintillator of the array of scintillators is physically separate from each other and covers a respective grid hole of the array of grid holes.

In some embodiments, the structure may further include a layer of poly(p-xylylene) polymers deposited on the array of scintillators.

In one aspect, a method of fabricating an X-ray imaging system may include: forming an array of photodiodes, which are electrically isolated from each other, in a device layer on a first side of a silicon wafer; forming an array of grid holes on a second side of the silicon wafer opposite the first side thereof, each grid hole of the array of grid holes aligned with a respective photodiode of the array of photodiodes; disposing a layer of scintillating material over the array of grid holes on the second side of the silicon wafer; disposing a layer of reflective material on the layer of scintillating material; forming an array of sensing circuits such that each sensing circuit of the array of sensing circuits is configured to sense an electrical signal in a respective photodiode of the array of photodiodes corresponding to electron-hole pairs in the respective photodiode caused by light absorbed by the respective photodiode; and bonding the array of sensing circuits to the array of photodiodes on the first side of the silicon wafer such that each sensing circuit of the array of sensing circuits is electrically connected to the respective photodiode.

In some embodiments, the silicon wafer may include a silicon-on-insulator (SOI) wafer.

In some embodiments, the grid holes on the second side of the SOI wafer may reach an insulator of the SOI wafer.

In some embodiments, the scintillating material may include CsI:Ta.

In some embodiments, the reflective material may include aluminum (Al).

In some embodiments, in disposing the layer of scintillating material over the array of grid holes, the method may perform operations including: filling the grid holes with the scintillating material; and depositing the layer of scintillating material over the array of grid holes which are filled with the scintillating material.

In some embodiments, a thickness of the layer of scintillating material may be greater than or equal to a depth of the grid holes.

In some embodiments, the method may further include filling the grid holes with a filler material.

In some embodiments, the filler material may include a transparent solid material. In some embodiments, the transparent solid material may include silicon dioxide (SiO$_2$), polyimide, or glass.

Alternatively, the filler material may include a scintillating material. In some embodiments, the scintillating material may include CsI:Ta.

In some embodiments, the method may further include, prior to filling the grid holes with the filler material, coating a layer of refractive material on sidewalls of the grid holes.

In some embodiments, the method may further include, prior to disposing the layer of reflective material on the layer of scintillating material, etching the layer of scintillating material into an array of scintillators such that each scintillator of the array of scintillators is physically separate from each other and covers a respective grid hole of the array of grid holes.

In some embodiments, the method may further include depositing a layer of poly(p-xylylene) polymers on the array of scintillators.

Additional Notes

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

As used to describe such embodiments, terms such as "above", "below", "upper", "lower", "top", "bottom", "horizontal", "vertical" and "side", for example, describe positions relative to an arbitrary axis of an element. In particular, the terms "above" and "below" refer to positions along an axis, where "above" refers to one side of an element while "below" refers to an opposite side of an element. Relative to terms "above" and "below", the term "side" refers to a side of an element that is displaced from an axis, such as the periphery of the element, for example. Further, it is understood that such terms do not necessarily refer to a direction defined by gravity or any other particular orientation reference. Instead, such terms are merely used to identify one portion versus another portion. Accordingly, "upper" and "lower" may be equivalently interchanged with "top" and "bottom", "first" and "second", "right" and "left", and so on. The term "horizontal" may refer to an orientation perpendicular to an axis while the term "vertical" may refer to an orientation parallel to the same axis, and vice versa.

The terms "and", "and/or" and "or" as used herein may include a variety of meanings that are expected to depend at least in part upon the context in which such terms are used. Typically, the term "or" as well as "and/or", if used to associate a list, such A, B or C, is intended to mean A, B and C, used in the inclusive sense, as well as A, B or C, used in the exclusive sense. In addition, the term "one or more" as used herein may be used to describe any feature, structure, or characteristic in the singular or plural sense to describe some combination of features, structures or characteristics. Though, it should be noted that this is merely an illustrative example and the claimed subject matter of the present disclosure is not limited to this example.

Although the present disclosure is described in terms of certain preferred embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the scope of the present disclosure.

What is claimed is:

1. A structure implemented in an X-ray imaging system, comprising:
    a silicon wafer having a first side and a second side opposite the first side, the silicon wafer comprising:
        an array of pixels, each of the pixels comprising a photo pixel connected to a sense pixel, wherein the photo pixel further comprises a photodiode on the first side of the silicon wafer aligned with an optical guide on the second side of the silicon wafer, wherein the optical guide comprises a grid hole having a sidewall coated with a layer of refractive material, and wherein the sense pixel further comprises a sensing circuit for an electrical signal caused by light absorbed by the respective photo pixel;
    a layer of scintillating material disposed over the optical guides on the second side of the silicon wafer; and
    a layer of reflective material disposed on the layer of scintillating material.

2. The structure of claim 1, wherein the silicon wafer comprises a silicon-on-insulator (SOI) wafer.

3. The structure of claim 2, wherein the grid holes on the second side of the SOI wafer reach an insulator of the SOI wafer.

4. The structure of claim 1, wherein the scintillating material comprises CsI:Ta.

5. The structure of claim 1, wherein the reflective material comprises aluminum (Al).

6. The structure of claim 1, wherein the grid holes are filled with a filler material.

7. The structure of claim 6, wherein the filler material comprises a transparent solid material.

8. The structure of claim 7, wherein the transparent solid material comprises silicon dioxide ($SiO_2$), polyimide, or glass.

9. The structure of claim 6, wherein the filler material comprises a scintillating material.

10. The structure of claim 9, wherein the scintillating material comprises CsI:Ta.

11. The structure of claim 1, wherein a thickness of the layer of scintillating material is greater than or equal to a depth of the grid holes.

12. The structure of claim 1, wherein the layer of scintillating material comprises an array of scintillators such that each scintillator of the array of scintillators is physically separate from each other and covers a respective grid hole of the array of grid holes.

13. The structure of claim 12, further comprising:
    a layer of poly(p-xylylene) polymers deposited on the array of scintillators.

14. A structure implemented in an X-ray imaging system, comprising, comprising:
    a silicon wafer comprising a first side and a second side opposite the first side, the silicon wafer further comprising an array of optical guides on the second side of the silicon wafer, each optical guide of the array of optical guides aligned with a respective photodiode of the array of photodiodes, each optical guide further comprising a grid hole having a sidewall coated with a layer of refractive material;
    a layer of scintillating material disposed over the array of grid holes on the second side of the silicon wafer; and
    a layer of reflective material disposed on the layer of scintillating material.

15. The structure of claim 14, wherein the silicon wafer comprises a silicon-on-insulator (SOI) wafer.

16. The structure of claim 15, wherein the grid holes on the second side of the SOI wafer reach an insulator of the SOI wafer.

17. The structure of claim 14, wherein the scintillating material comprises CsI:Ta.

18. The structure of claim 14, wherein the reflective material comprises aluminum (Al).

19. The structure of claim 14, wherein the grid holes are filled with a filler material.

20. The structure of claim 19, wherein the filler material comprises a transparent solid material.

21. The structure of claim 20, wherein the transparent solid material comprises silicon dioxide ($SiO_2$), polyimide, or glass.

22. The structure of claim 19, wherein the filler material comprises a scintillating material.

23. The structure of claim 22, wherein the scintillating material comprises CsI:Ta.

24. The structure of claim 14, wherein a thickness of the layer of scintillating material is greater than or equal to a depth of the grid holes.

25. The structure of claim 14, wherein the layer of scintillating material comprises an array of scintillators such that each scintillator of the array of scintillators is physically separate from each other and covers a respective grid hole of the array of grid holes.

26. The structure of claim 25, further comprising:
    a layer of poly(p-xylylene) polymers deposited on the array of scintillators.

27. A method of fabricating an X-ray imaging system, comprising:
- forming an array of photodiodes, which are electrically isolated from each other, in a device layer on a first side of a silicon wafer;
- forming an array of optical guides on a second side of the silicon wafer opposite the first side thereof, each optical guide of the array of optical guides aligned with a respective photodiode of the array of photodiodes, wherein the forming of the array of optical guides comprises forming an array of grid holes and coating a layer of refractive material on sidewalls of grid holes;
- disposing a layer of scintillating material over the array of grid holes on the second side of the silicon wafer;
- disposing a layer of reflective material on the layer of scintillating material;
- forming an array of sensing circuits such that each sensing circuit of the array of sensing circuits is configured to sense an electrical signal in a respective photodiode of the array of photodiodes corresponding to electron-hole pairs in the respective photodiode caused by light absorbed by the respective photodiode; and
- bonding the array of sensing circuits to the array of photodiodes on the first side of the silicon wafer such that each sensing circuit of the array of sensing circuits is electrically connected to the respective photodiode.

28. The method of claim 27, wherein the silicon wafer comprises a silicon-on-insulator (SOI) wafer.

29. The method of claim 28, wherein the grid holes on the second side of the SOI wafer reach an insulator of the SOI wafer.

30. The method of claim 27, wherein the scintillating material comprises CsI:Ta.

31. The method of claim 27, wherein the reflective material comprises aluminum (Al).

32. The method of claim 27, wherein disposing the layer of scintillating material over the array of grid holes comprises:
- filling the grid holes with the scintillating material; and
- depositing the layer of scintillating material over the array of grid holes which are filled with the scintillating material.

33. The method of claim 27, wherein a thickness of the layer of scintillating material is greater than or equal to a depth of the grid holes.

34. The method of claim 27, further comprising:
- filling the grid holes with a filler material.

35. The method of claim 34, wherein the filler material comprises a transparent solid material.

36. The method of claim 35, wherein the transparent solid material comprises silicon dioxide ($SiO_2$), polyimide, or glass.

37. The method of claim 36, further comprising:
- prior to disposing the layer of reflective material on the layer of scintillating material, etching the layer of scintillating material into an array of scintillators such that each scintillator of the array of scintillators is physically separate from each other and covers a respective grid hole of the array of grid holes.

38. The method of claim 37, further comprising:
- depositing a layer of poly(p-xylylene) polymers on the array of scintillators.

39. The method of claim 34, wherein the filler material comprises a scintillating material.

40. The method of claim 39, wherein the scintillating material comprises CsI:Ta.

* * * * *